(12) United States Patent
Blamey et al.

(10) Patent No.: US 7,978,868 B2
(45) Date of Patent: Jul. 12, 2011

(54) ADAPTIVE DYNAMIC RANGE OPTIMIZATION SOUND PROCESSOR

(75) Inventors: Peter Blamey, South Yarra (AU);
Christopher John James, Toulouse (FR); Hugh J. Mcdermott, Mt. Macedon (AU); Lois Martin, Hawthorne (AU); Konrad Wildi, Kretenweg (CH)

(73) Assignee: Cochlear Limited, Macquarie University, NSW ( * ) Notice: Subject to any disclaimer, the term of this patent is extended or adjusted under 35 U.S.C. 154(b) by 650 days.

(21) Appl. No.: 12/025,890

(22) Filed: Feb. 5, 2008

(65) Prior Publication Data

US 2008/0123883 A1 May 29, 2008

Related U.S. Application Data

(60) Division of application No. 10/817,227, filed on Apr. 2, 2004, now Pat. No. 7,366,315, which is a continuation-in-part of application No. 09/478,022, filed on Jan. 5, 2000, now Pat. No. 6,731,767.

(30) Foreign Application Priority Data

Feb. 5, 1999 (WO) .................. PCT/AU99/00076

(51) Int. Cl.
    *H04R 25/00* (2006.01)
(52) U.S. Cl. ......... 381/312; 381/316; 381/320; 381/321
(58) Field of Classification Search .................. 381/312, 381/316, 317, 318, 320, 321, 94.2, 94.3, 381/57
    See application file for complete search history.

(56) References Cited

U.S. PATENT DOCUMENTS

| | | | |
|---|---|---|---|
| 4,204,260 A | 5/1980 | Nysen | |
| 4,390,756 A | 6/1983 | Hoffmann et al. | |
| 4,532,930 A | 8/1985 | Crosby et al. | |
| 4,596,902 A | 6/1986 | Gilman | |
| 4,833,717 A | 5/1989 | Nakamura et al. | |
| 4,852,175 A | 7/1989 | Kates | |
| 4,856,522 A | 8/1989 | Hansen | |
| 4,882,762 A | 11/1989 | Waldhauer | |
| 5,027,410 A | 6/1991 | Williamson et al. | |
| 5,029,217 A | 7/1991 | Chabries et al. | |
| 5,661,699 A | 8/1997 | Sutton | |

(Continued)

FOREIGN PATENT DOCUMENTS

EP          0 077 688        4/1983

(Continued)

OTHER PUBLICATIONS

Dunn, et al., "Statistical Measurements on Conversational Speech," *J.A.S.A.*, Jan. 1940, vol. 11.

(Continued)

*Primary Examiner* — Tuan D Nguyen
(74) *Attorney, Agent, or Firm* — Kilpatrick Townsend & Stockton LLP

(57) ABSTRACT

In one embodiment, an apparatus for processing sound includes a means (401) for analyzing a sound signal into a number of frequency bands and a means (403) for applying variable gain to each frequency band independently. Gain in applied under control of a number of gain comparator means (409) each of which generates a number of statistical distribution estimates in respect of each signal and compares those estimates to predetermined hearing response parameters stored in memory (411). The numerous gain compensated frequency bands are then combined (415) in order to generate a single sound signal. The apparatus may be implemented in dedicated hardware embodiment or by software running on a microprocessor.

27 Claims, 9 Drawing Sheets

U.S. PATENT DOCUMENTS

| | | | |
|---|---|---|---|
| 5,687,241 A | 11/1997 | Ludvigsen | |
| 5,724,433 A | 3/1998 | Engebretson et al. | |
| 5,794,187 A | 8/1998 | Franklin et al. | |
| 6,094,489 A | 7/2000 | Ishige et al. | |

FOREIGN PATENT DOCUMENTS

| | | | |
|---|---|---|---|
| EP | 0077688 | A1 | 4/1983 |
| EP | 0 250 679 | | 1/1988 |
| EP | 0250679 | A2 | 1/1988 |
| EP | 0 326 905 | | 8/1989 |
| EP | 0326905 | A1 | 8/1989 |
| EP | 0 337 868 | | 10/1989 |
| EP | 0337868 | A2 | 10/1989 |
| GB | 2 091 065 | | 7/1982 |
| GB | 2091065 | A | 7/1982 |
| JP | 04113800 | | 4/1992 |
| JP | 08-223698 | | 8/1996 |
| JP | 08-317496 | | 11/1996 |
| JP | 10-094095 | | 4/1998 |
| WO | WO 85/02085 | | 5/1985 |
| WO | WO-85/02085 | | 5/1985 |
| WO | WO 96/35314 | | 11/1996 |
| WO | WO-96/35314 | | 11/1996 |
| WO | WO 98/27787 | | 6/1998 |
| WO | WO-98/27787 | | 6/1998 |
| WO | WO 98/56210 | | 12/1998 |
| WO | WO 00/47014 | | 8/2000 |

OTHER PUBLICATIONS

James, et al., "Adaptive Dynamic Range Optimization for Cochlear Implants: A Preliminary Study," *Ear & Hearing*, Feb. 2002.

Blamey, et al., "Monaural and Binaural Loudness Measures in Cochlear Implant Users with Contralateral Residual Hearing," *Ear & Hearing*, vol. 21, No. 1.

Written Opinion for PCT/AU99/0076 dated Oct. 6, 2000.

International Preliminary Examination Report for PCT/AU99/0076 dated Jan. 4, 2001.

Supplemental European Search Report for EP 99 90 4619 dated Jun. 17, 2003.

European Search Report for EP 99 90 4619 dated Nov. 11, 2003.

Office Action dated Mar. 27, 2003 (Paper No. 8), U.S. Appl. No. 09/478,022, filed Jan. 5, 2000, Inventors: Blamey et al (Front page and Form PTO 892, only).

International Search Report dated Apr. 1, 1999, corresponding PCT/AU99/00076, filed Feb. 5, 1999, published as WO 00/47014 on Aug. 10, 2000, applicant: The University of Melbourne et al.

JP Office Action dated Nov. 27, 2007.

Written Opinion dated Oct. 6, 2000, corresponding PCT/AU99/00076, filed Feb. 5, 1999, published as WO 00/47014 on Aug. 10, 2000, applicant: The University of Melbourne et al.

ADAPTIVE DYNAMIC RANGE OPTIMIZATION SOUND PROCESSOR

CROSS-REFERENCE TO RELATED APPLICATION

This application is a divisional application of U.S. patent application Ser. No. 10/817,227 entitled Adaptive Dynamic Range Optimisation Sound Processor" and filed Apr. 2, 2004, which is a Continuation-in-part of application Ser. No. 09/478,022 filed Jan. 5, 2000, now U.S. Pat. No. 6,731,767 issued on May 4, 2004, which claims priority from International Application No. PCT/AU99/00076 filed Feb. 5, 1999. The entire disclosure and contents of the above applications are hereby incorporated by reference herein.

FIELD OF THE INVENTION

The present invention relates to the field of devices and methods for processing sound and in particular to a processor for improving the speech perception and comfort of a hearing impaired user. However, while the invention is suited for use with hearing impaired people it will also find application in other communication areas.

BACKGROUND OF THE INVENTION

In general the effects of hearing impairment are characterised by the undesirable conditioning of a sound signal, for example spoken words, along a listener's hearing chain so as to result in attenuation and often distortion of the signal.

Relatively simple linear gain hearing aids, for example fixed gain aids, have been successful in amplifying sounds to make them audible and recognisable. One problem with fixed gain aids however is that they are usually not suitable for use over a wide range of sound frequencies and Levels. For example, when using a fixed gain aid the listener often finds that some sounds are inaudible, that is below hearing threshold, while others are at, or above, the loudness discomfort level, (LDL). Such a problem is especially prevalent when the listener is a person with a narrow dynamic range between the threshold and LDL levels.

Multi-band compression schemes attempt to overcome the problems of narrow dynamic range by adapting the gain of the aid in response to changes in the input sound level within a number of frequency bands, that is, they make use of a non-linear compression scheme. However, non-linear compression schemes introduce distortions into the output signals which reduce speech intelligibility. Hearing aids incorporating multi-band compression schemes are also difficult to fit and may require a lengthy investigation of the subject's hearing response.

One type of multi-channel hearing aid is the subject of U.S. Pat. No. 5,687,241 to Ludvigsen. In that document there is described a multi-channel hearing aid which splits an input signal into a number of parallel, filtered channels. The filtered, input signals are each monitored by a percentile estimator and on the basis of control signals generated by the percentile estimators the gain of each of the filtered signals is adjusted. The filtered, gain adjusted signals are then recombined, amplified and converted to an acoustic signal.

A problem with the aid of U.S. Pat. No. 5,687,241 is that the percentile estimators must be capable of accommodating large swings in the amplitude of the signal being monitored. Consequently in a digital implementation considerable processing power is required in order to undertake the percentile estimation calculations.

A further problem that arises during the operation of multi-channel hearing aids is that fast transient signals having magnitudes exceeding the maximum comfort level may arise. Typically such transients occur in only a small number of channels at a particular time however in order to prevent discomfort to the user of the aid the general prior art approach has been to reduce the total power output of the aid. While such an approach prevents discomfort it causes undesirable distortion of the signal in channels unaffected by fast transient signals.

Single channel automatic gain control (AGC) hearing aids operate to reduce the gain at all frequencies in the event that the level of a sound should reach a predetermined point. While such hearing aids prevent the sound from reaching the subject's LDL they also attenuate some frequency components of the speech signal to such an extent that the intelligibility of the speech is reduced.

In summary, prior art hearing aids have associated with their use a variety of problems. Such problems range from inappropriate compression of signal, which causes undue signal distortion, to onerous processing requirements which make the aids expensive and difficult to implement.

In light of the prior art it is an object of the present invention to provide an apparatus which, in the presence of an ambient sound signal, generates a transformed sound signal which conforms to predetermined amplitude requirements within a range of audible frequencies.

It is a further object of the invention to provide a means whereby fast transient signals may be suppressed, in order to prevent discomfort to the user of a multi-channel hearing aid, without introducing signal distortion into channels unaffected by said transient signals.

SUMMARY OF THE INVENTION

In accordance with one aspect of the present invention, there is provided an apparatus for processing an ambient sound signal including:

input means for receiving the ambient sound signals;

means for performing a Fourier transform on the input signal and providing an input spectrum having discrete frequency components each including a coefficient defining the magnitude of the component;

means for multiplying the magnitude coefficients by a predetermined gain value and providing magnitude adjusted frequency components;

means for comparing the amplitude of the magnitude adjusted frequency components with predetermined values;

means for attenuating the magnitude of those adjusted frequency components whose magnitude is greater than the predetermined values; and output means for an output spectrum signal including the frequency components and respective adjusted and attenuated magnitudes.

In accordance with another aspect of the present invention, there is provided a method for processing an ambient sound signal including the steps of:

performing a Fourier transform on the ambient sound signal and generating an input spectrum having discrete frequency components each including a co-efficient defining the magnitude of the component;

multiplying the magnitude coefficients by a predetermined gain value and providing magnitude adjusted frequency components;

comparing the amplitude of the magnitude adjusted frequency components with predetermined values;

attenuating the magnitude of those adjusted frequency components whose magnitude is greater than the predetermined values; and providing an output spectrum signal including the frequency components and respective adjusted and attenuated magnitudes.

In accordance with another aspect of the present invention, there is provided a method for processing an ambient sound signal including the steps of:

a) performing a frequency analysis on the ambient sound signal to generate a plurality of analysis signals corresponding to the ambient sound signal;

b) multiplying each of said plurality of analysis signals by a corresponding one of a plurality of gain values to produce a plurality of magnitude adjusted analysis signals;

c) determining distribution values characteristic of the amplitude distribution of each of the plurality of magnitude adjusted analysis signals over a period of time;

d) setting said gain values on the basis of comparisons between said distribution values and any one or more of a plurality of hearing response parameters;

e) processing said plurality of magnitude adjusted analysis signals to form an output signal; and g) feeding said output signal to a monaural or binaural system having any one or more selected from the group comprising: a headphone, a hearing aid, a cochlear implant and a mechanical activator driving an ossicle in the middle ear of a patient.

In accordance with another aspect of the present invention, there is provided a method for processing an ambient sound signal including the steps of:

a) performing a frequency analysis on the ambient sound signal to generate a plurality of analysis signals corresponding to the ambient sound signal;

b) multiplying each of said plurality of analysis signals by a corresponding one of a plurality of gain values to produce a plurality of magnitude adjusted analysis signals;

c) determining distribution values characteristic of the amplitude distribution of each of the plurality of magnitude adjusted analysis signals over a period of time;

d) setting said gain values on the basis of comparisons between said distribution values and a plurality of hearing response parameters e) processing said plurality of magnitude adjusted analysis signals to form an electric output signal; and f) feeding said output signal to a cochlear implant system.

In accordance with another aspect of the present invention, there is provided a method for processing an ambient sound signal including the steps of:

a) performing a frequency analysis on the ambient sound signal to generate a plurality of analysis signals corresponding to the ambient sound signal;

b) multiplying each of said plurality of analysis signals by a corresponding one of a plurality of gain values to produce a plurality of magnitude adjusted analysis signals;

c) determining distribution values characteristic of the amplitude distribution of each of the plurality of magnitude adjusted analysis signals over a period of time;

d) setting said gain values on the basis of comparisons between said distribution values and a plurality of hearing response parameters e) combining said plurality of magnitude adjusted analysis signals to form a combined signal;

f) processing said combined signal to generate an output signal; and g) feeding said output signal to a mechanical activator driving an ossicle in the middle ear of a patient.

In accordance with another aspect of the present invention, there is provided a method for processing an ambient sound signal for a binaural system, including the steps of:

a) performing a frequency analysis on the ambient sound signal to generate a plurality of analysis signals corresponding to the ambient sound signal;

b) multiplying each of said plurality of analysis signals by a corresponding one of a plurality of gain values to produce a plurality of magnitude adjusted analysis signals;

c) determining distribution values characteristic of the amplitude distribution of each of the plurality of magnitude adjusted analysis signals over a period of time;

d) setting said gain values on the basis of comparisons between said distribution values and a plurality of hearing response parameters e) combining said plurality of magnitude adjusted analysis signals to form a combined signal;

f) processing said combined signal to generate a sound output signal; and g) feeding said sound output signal to a hearing aid, or a headphone, or other electro-acoustic output transformer.

In accordance with another aspect of the present invention, there is provided an apparatus for processing an ambient sound signal including:

a) a frequency analysis means arranged to generate a plurality of analysis signals corresponding to said ambient signal;

b) a magnitude adjustment means coupled to the frequency analysis means and arranged to adjust the magnitude of each of said analysis signals to produce a plurality of magnitude adjusted analysis signals;

c) a distribution estimation means responsive to said plurality of magnitude adjusted analysis signals and arranged to generate distribution values characteristic of the amplitude distribution of each of the said plurality of magnitude adjusted analysis signals over a period of time; and d) a comparison means coupled to the distribution estimation means and arranged to perform comparisons of said distribution values with predetermined hearing response parameters, said comparison means controlling said magnitude adjustment means on the basis of said comparisons;

wherein the magnitude adjustment means, the distribution estimation means and the comparison means are implemented by a programmed microprocessor coupled to memory storage means, said memory means storing the hearing response parameters and include at least one the maximum comfortable levels, optimum audibility levels and threshold levels for each of the plurality of frequency components.

In accordance with another aspect of the present invention, there is provided a computer readable medium, having a program recorded thereon, where the program is configured to cause a computer to execute a method for processing an ambient sound signal, said method including the steps of:

a) performing a frequency analysis on the ambient sound signal to generate a plurality of analysis signals corresponding to the ambient sound signal;

b) multiplying each of said plurality of analysis signals by a corresponding one of a plurality of gain values to produce a plurality of magnitude adjusted analysis signals;

c) determining distribution values characteristic of the amplitude distribution of each of the plurality of magnitude adjusted analysis signals over a period of time;

d) setting said gain values on the basis of comparisons between said distribution values and any one or more of a plurality of hearing response parameters; and e) processing said plurality of magnitude adjusted analysis signals to form an output signal.

DESCRIPTION OF THE PREFERRED EMBODIMENTS

Figure 1:
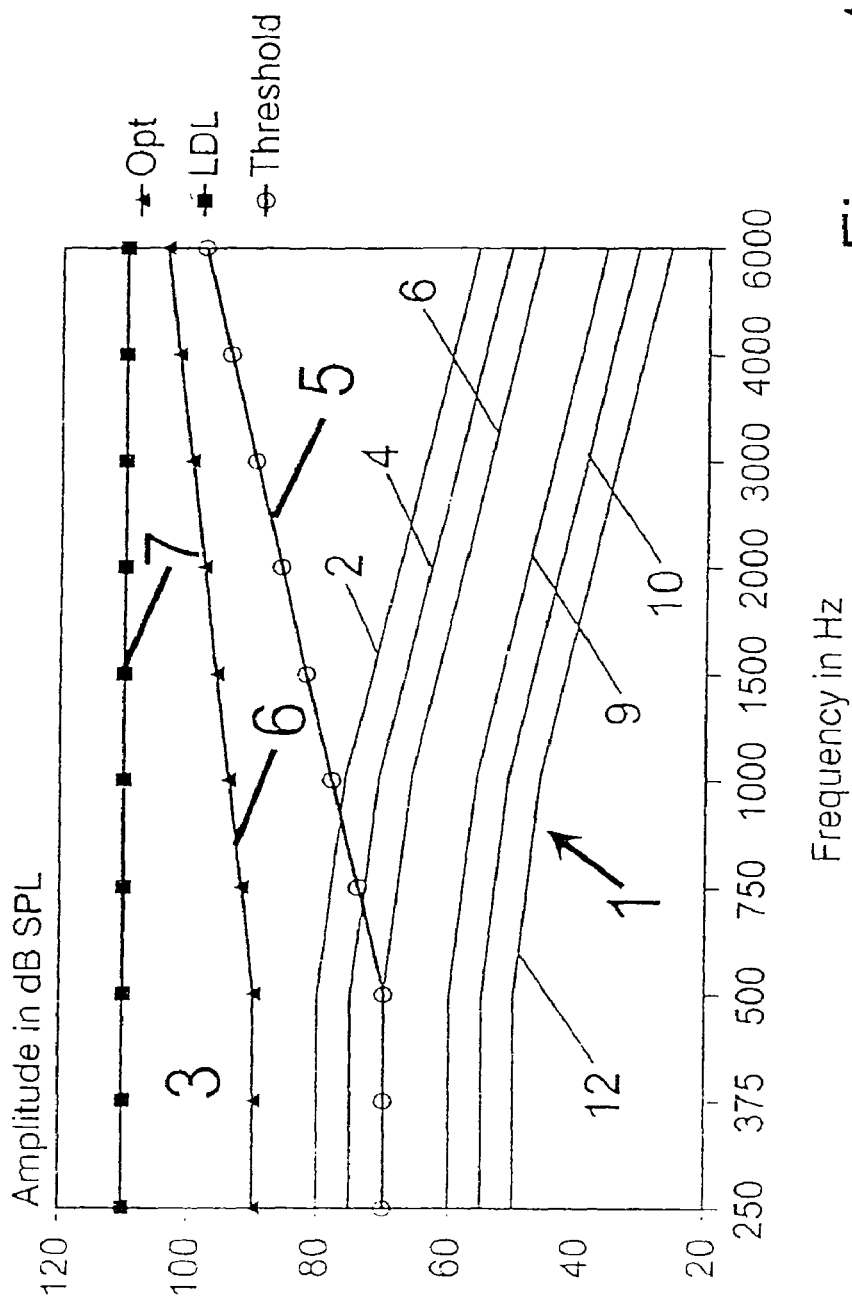
FIG. 1 is an amplitude vs frequency graph including hypothetical threshold and loudness discomfort level lines for an unaided, severely hearing impaired, listener. The shaded regions indicate a hypothetical distribution of amplitudes for a speech signal in low background noise.

Referring now to FIG. 1 there is shown a graph with horizontal axis being Frequency in Hz and vertical axis being amplitude in dB of sound pressure level (SPL). Plotted on the graph is a speech signal region 1 which represents the amplitude and frequency distribution of the speech of a single speaker in a quiet room. Region 1 is demarcated into 5 sub-regions bounded by lines 2, 4, 8, 9, 10 and 12. The sub-region between lines 2 and 4 represents the 90-100th percentile distribution of the single speaker speech signal across the 250 Hz-6000 Hz frequency range. Similarly lines 4 and 8 bound the 70th-90th percentile, lines 8 and 9 the 30th-70th percentile, lines 9 and 10 the 10th-30th percentile and lines 10 and 12 the $0^{th}$ to $10^{th}$ percentile. For further information regarding such graphs, reference can be made to a paper by H K Dunn and S D White, entitled "Statistical Measurements on Conversational Speech", Journal of the Acoustical Society of America, 11: 278-288, 1940. The paper includes measured amplitude distributions for male and female speakers in quiet.

Also plotted on the graph of FIG. 1 is the hearing response 3 of a severely hearing impaired listener. Hearing response 3 is bounded at its lower border by threshold level 5 and at its upper border by LDL 7. Speech signal frequency components which fall between these two levels will be perceived by the hearing impaired person while those that fall below will not. In the case of FIG. 1 it will be realised that the frequency components of the speech signal in the range 1000-6000 Hz are all below the threshold of the listener. For example, at 4000 Hz the listener's threshold level is about 95 dB and the maximum speech level is about 60 dB. Also plotted on the graph of FIG. 1 is the optimum audible level 6.

Figure 2:
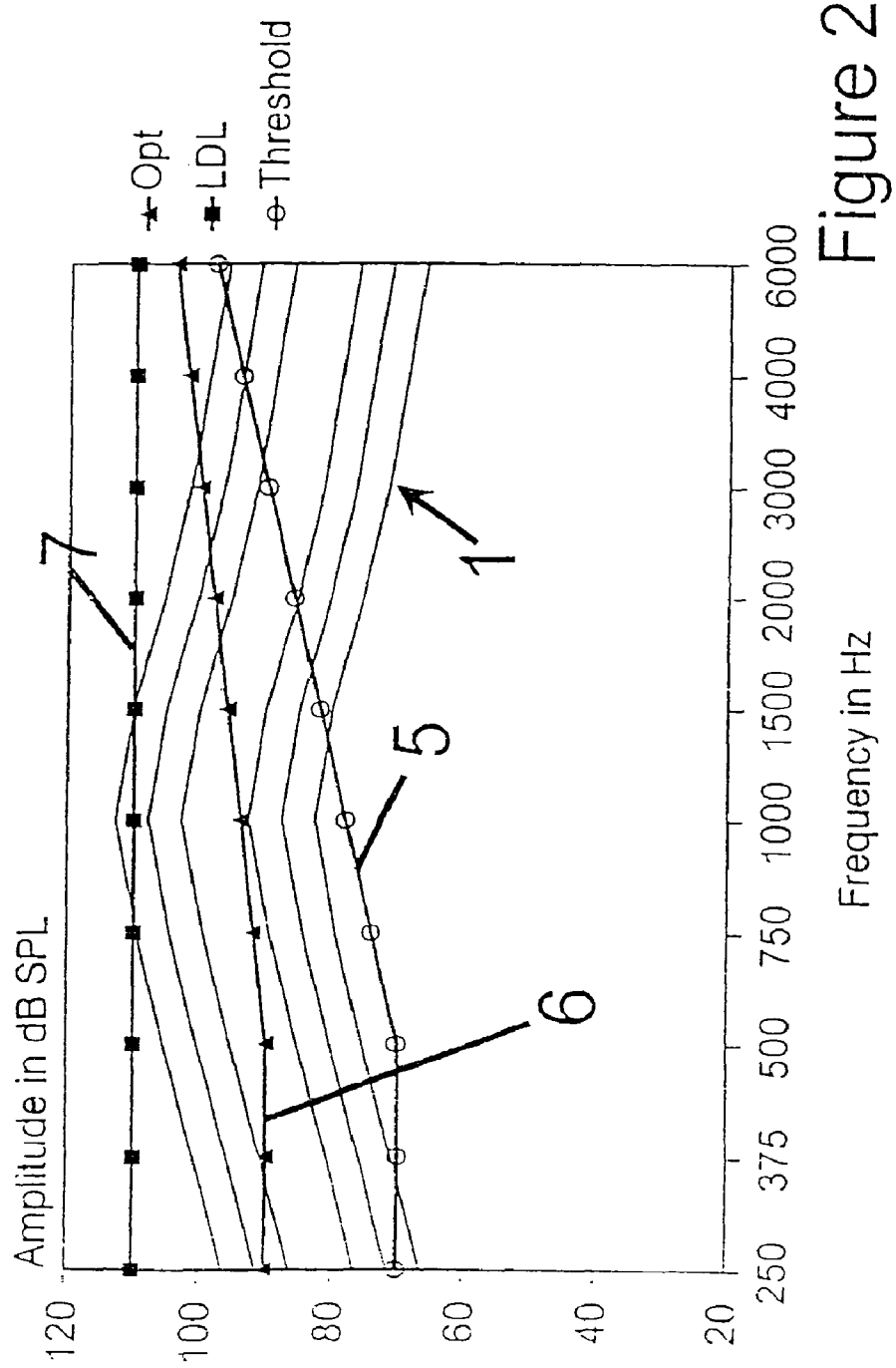
FIG. 2 is a graph similar to FIG. 1 wherein the speech signal has been amplified by a linear gain hearing aid.

Referring now to FIG. 2 there is depicted once again the frequency distribution 1 of the speech of a single speaker in a quiet room and also the hearing response of the severely hearing impaired person of FIG. 1, this time amplitude distribution is now about 100 dB. Accordingly the top 10% of the speech signal at 4000 Hz is now audible. The remaining 90% of the amplitude distribution of speech at 4000 Hz falls below the threshold level and is not heard at all. The upper part of the speech amplitude distribution at 1000 Hz lies above the LDL of 110 dB SPL and will produce an uncomfortably loud sound unless limited by an AGC which would reduce the audibility at 4000 Hz and other frequencies, or by peak clipping (a form of instantaneous non linear compression) which would introduce distortion across a wide range of frequencies.

Figure 3:
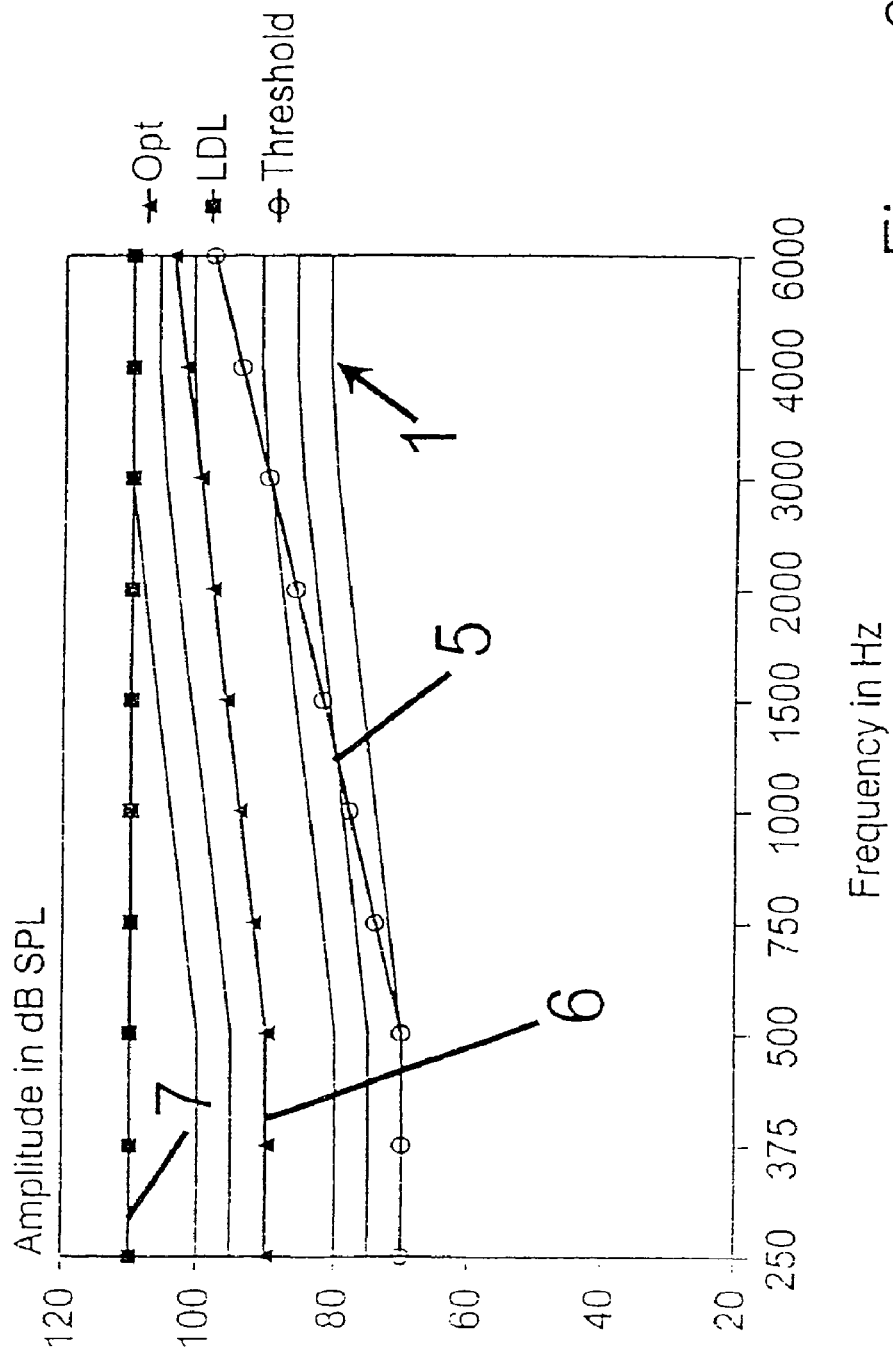
FIG. 3 is a graph similar to FIG. 1 and FIG. 2 wherein the speech signal has been processed according to the present invention.

Referring now to FIG. 3 there is depicted a third graph, this time illustrating the hearing response of the severely hearing impaired subject of FIG. 1 when wearing an adaptive dynamic range optimisation (ADRO) hearing aid according to the present invention. It will be noted that the amplitude and frequency distribution 1 of the speech signal now falls almost entirely within the boundaries of the acceptable levels which may be presented to the hearing aid user, so that all the frequency components of the speech signal are perceived by the listener. Consequently there is a marked increase in audibility, a marked reduction in distortion, of the signal perceived by the subject, and a corresponding increase in intelligibility of the words comprising the signal.

At the same time, no frequency component of the output signal exceeds the listener's LDL. The construction and operational processes of a hearing aid according to the invention will now be explained.

Figure 4:
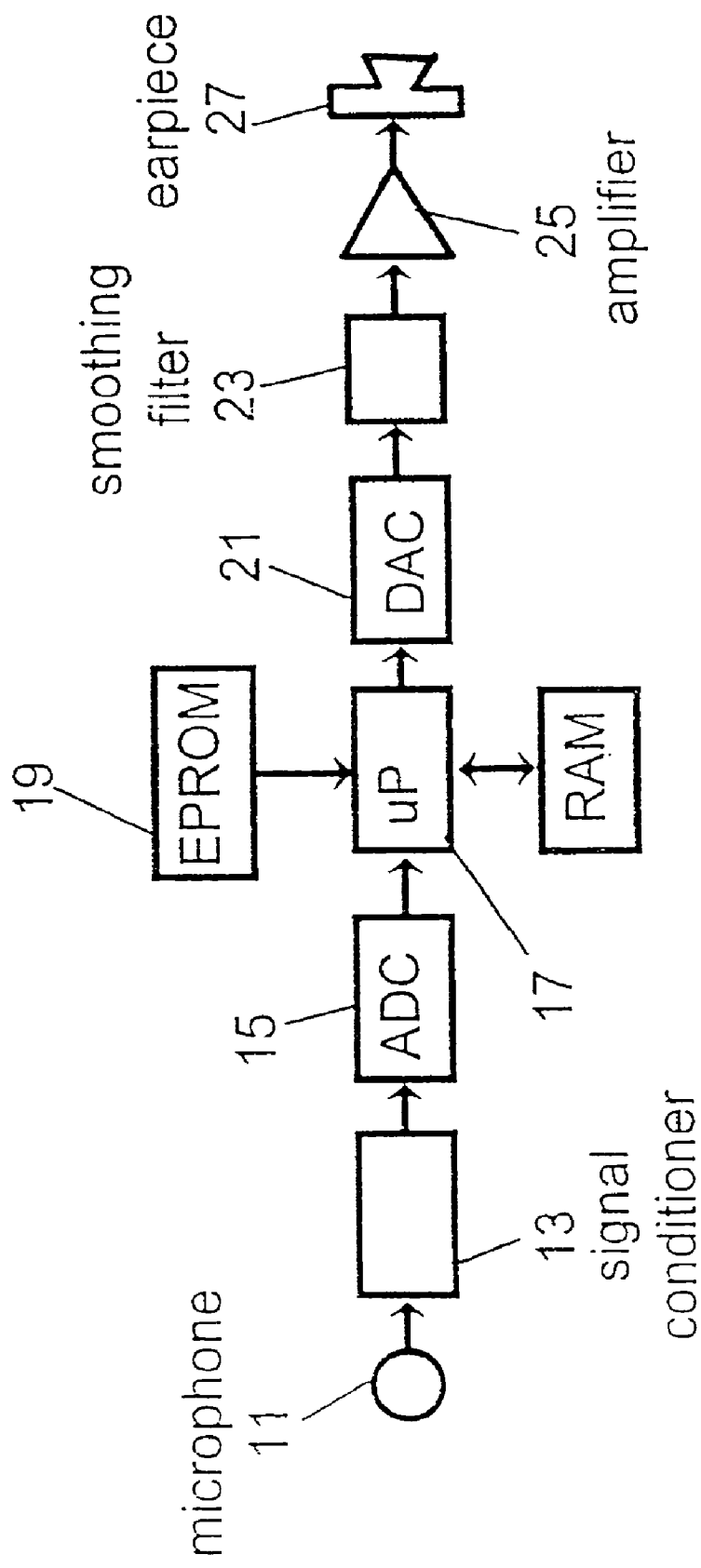
FIG. 4 schematically depicts a hearing aid constructed in accordance with the present invention.

With reference to FIG. 4 there is depicted a digital hardware implementation of the hearing aid. Sound waves are transduced by microphone 11 and, the electrical signal so produced, conditioned by analog conditioning module 13. Conditioning module 13 includes standard circuits for pre-amplifying and low pass filtering the signal prior to its processing by analog to digital converter 15. Analog to digital converter 15 produces a 16 bit digital signal which is conveyed to microprocessor 17. Microprocessor 17 operates according to a program stored in EPROM 19. The microprocessor performs a fast Fourier transform and generates an input spectrum which is processed, as will be described, to generate an output spectrum comprising a plurality of frequency components.

The output spectrum is then subjected to an inverse fast Fourier transform in order to produce a digital output signal. The digital output signal is passed to a suitable digital to analog converter 21 which generates an analog signal. The analog signal is passed through smoothing filter 23 and to power amplifier 25. The amplified signal then drives earpiece 27.

Figure 4A:
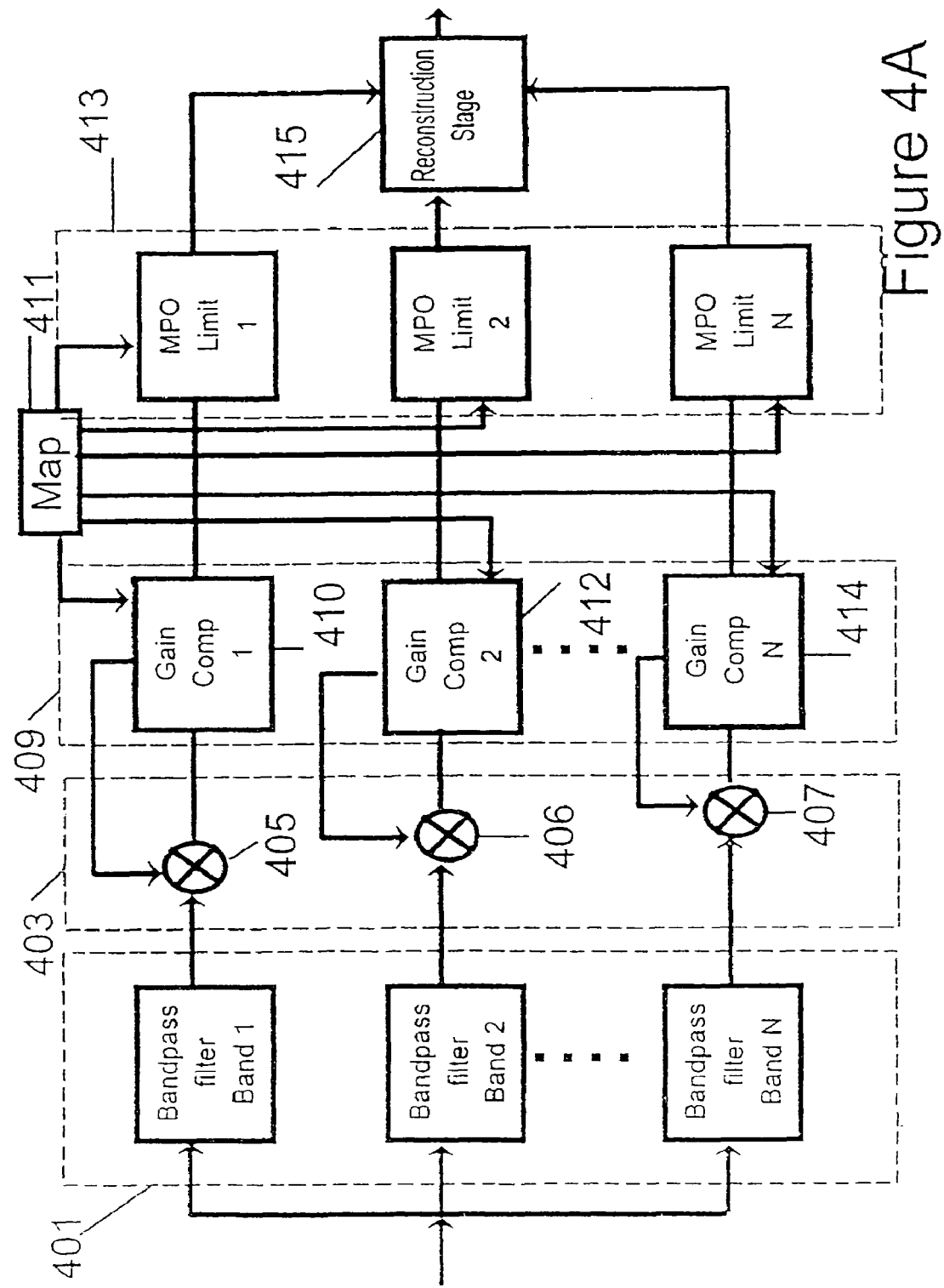
FIG. 4A schematically depicts a dedicated hardware implementation of a hearing aid constructed in accordance with the present invention.

FIG. 4a depicts a dedicated hardware implementation of the invention for purposes of explanation. While FIG. 4a illustrates the invention as if individual parts of processor 17 were embodied in dedicated hardware, the invention is most readily implemented by the arrangement of FIG. 4.

Referring to FIG. 4a, the signals from the ADC 15 are subjected to multi-channel frequency analysis and classified into n (for example n=8) frequency bands in analysis section 401. The frequency analysis depicted is carried out by means of n band-pass switched-capacitor filters.

The resulting n frequency analysis signals from frequency analysis section 401 are then conveyed to magnitude adjustment section 403. The magnitude of each of the n signals is adjusted by one of n gain control elements 405-407 under the control of a gain computation section 409 comprising n gain computation elements 410, 412, 414. Each of the n gain computation elements monitors a corresponding one of the n gain adjusted signals, processes its signal in a manner that will shortly be explained with reference to FIG. 4b, and controls the amount of gain applied by gain control elements 405-407 of magnitude adjustment section 403. Map 41 comprises a memory storing a set of previously determined hearing response parameters. The predetermined parameters are the threshold level (TL), the maximum comfortable level (MCL), maximum power output level (MPO), optimal audible level (OPT), and maximum gain level (MAXGAIN) for the intended user of the device at each of the centre frequencies of the n channels. The maximum gain level is just below the level at which feedback occurs for the channel in question during operation of the aid. The maximum gain level is determined during fitting of the aid.

The magnitude adjusted analysis signals are passed to maximum power output limiting section 413 comprised of n maximum power output limiters which compare each of the n signals with the corresponding predetermined maximum power output levelstored in map 411. The MPO limiters ensure that the signal cannot exceed the predetermined MPO value for each channel. The output limiters are designed to act within 0.1 milliseconds in order to suppress fast transients. It will be noted that the MPO limiters act independently so that a signal in a particular channel only affected if a fast transient has occurred in that channel. The n signals then pass to reconstruction stage 415 which recombines the n magnitude adjusted signals, typically by summing the waveforms from each channel.

Figure 4B:
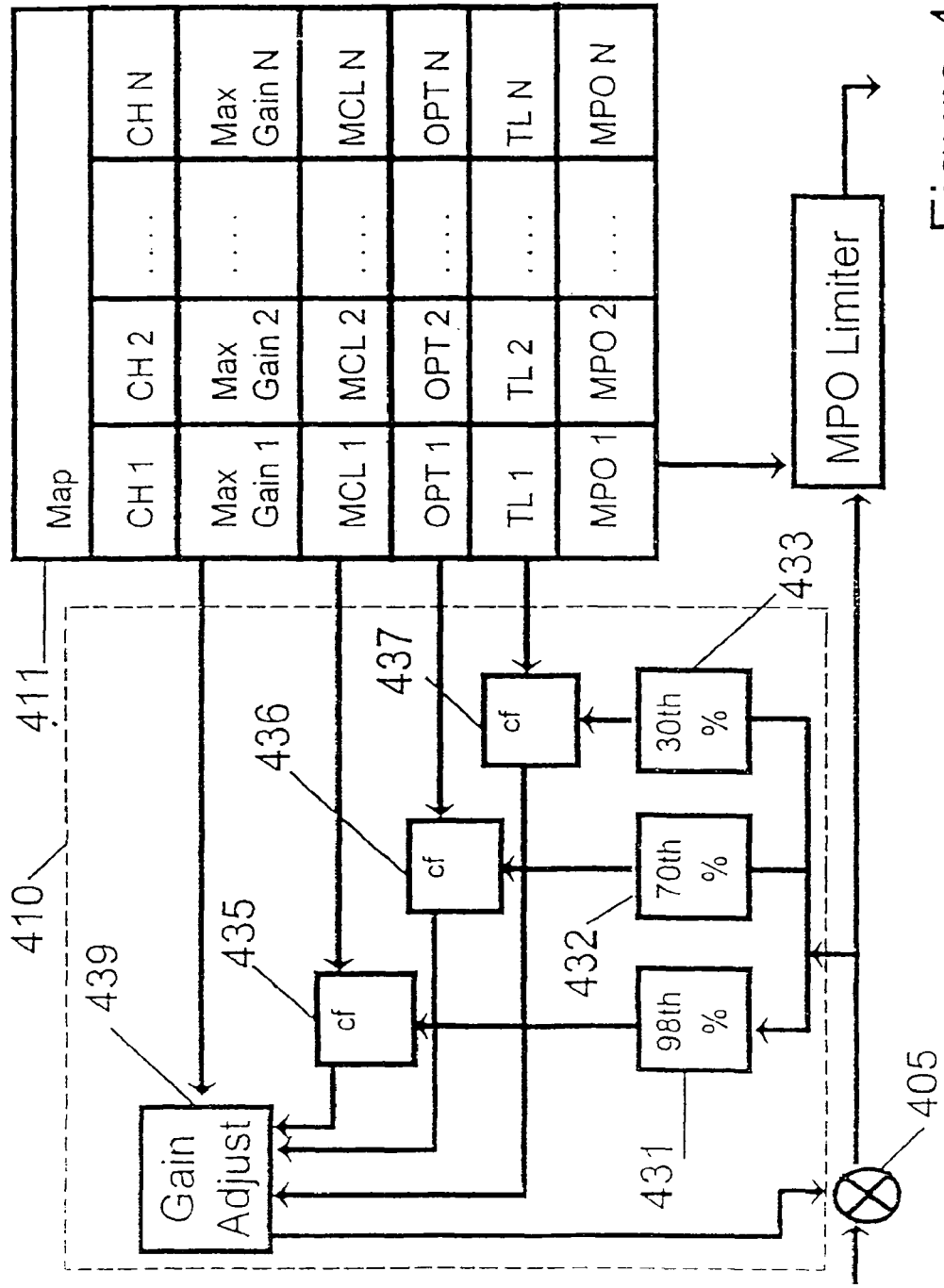
FIG. 4B schematically depicts, with greater detail, a portion of the apparatus depicted in FIG. 4A.

The signal processing operation of the first gain computation element of magnitude adjustment stage 409 will now be explained in greater detail with reference to FIG. 4b which illustrates the internal configuration of first gain computation element 410. The other gain computation elements are similarly arranged. It will be seen that the signal emanating from the adjustment element 405 is monitored by three percentile estimators 431-433. The percentile estimators each generate a ceiling value signal which indicates the level that the signal being monitored falls beneath for a particular percentage of the monitoring period. In the present embodiment the percentile estimators 431-433 are set to produce estimates of the ceiling values reached by the monitored signal 98% of the time, 70% of the time and 30% of the time respectively. As can be seen from FIGS. 1-3, when the monitored signal is derived from speech, the value that the signal falls beneath 98% of the time is much greater than the value that it falls beneath 30% of the time. The design of percentile estimator hardware is explained in U.S. Pat. No. 4,204,260 incorporated herein by reference.

The percentile level estimate signals generated by percentile estimators 431-433 are passed to comparators 435-437. Comparator 435 compares the 98th percentile estimate with the maximum comfortable level in respect of channel 1 which is stored in map 411. Similarly comparators 436 and 437 compare the 70th and 30th percentile estimates with the predetermined optimum audibility and threshold levels stored in map 411. The outcomes of the comparisons are conveyed to gain adjust unit 439. The gain adjust unit 439 is typically implemented as a programmable logic array that would control the gain of the amplifier 405 according to the following logic. In the event that the 98th percentile estimate exceeds the maximum comfortable level then the gain should reduce slowly. Otherwise, if the $70^{th}$ percentile estimate is below the optimum audibility level, the gain should increase slowly until the gain is equal to the corresponding MAXGAIN level stored in Map 411 or the 98th percentile estimate reaches the maximum comfortable level. Otherwise, if the 30th percentile estimate is above the threshold level, then the gain should fall slowly.

The rates of rise and fall of the gain control unit 405 are typically 3 to 10 dB per second. The level of gain to be applied is transmitted from gain adjust section 439 to gain adjustment element 405 and the magnitude of the signal is adjusted accordingly.

While the above description explains a dedicated hardware implementation of the invention, as previously explained it will be most convenient to implement the invention by means of an appropriately programmed digital signal processor integrated circuit as illustrated in FIG. 4.

The software for programming the digital signal processor EPROM 19 of FIG. 4 may be stored in a computer readable medium, including the storage devices described below, for example, before being loaded from the computer readable medium to the DSP chip.

In some instances, the software may be encoded on a CD-ROM or floppy disk. Alternatively the software may be read from a network via a modem device. Still further, the software can be loaded into the DSP chip from other computer readable medium including magnetic tape, a ROM or integrated circuit, a magneto-optical disk, a radio or infra-red transmission channel, a computer readable card such as a PCMCIA card, and the Internet and Intranets including e-mail transmissions and information recorded on Websites and the like. The foregoing is merely exemplary of relevant computer readable mediums. Other computer readable media may be practiced.

Figure 5:
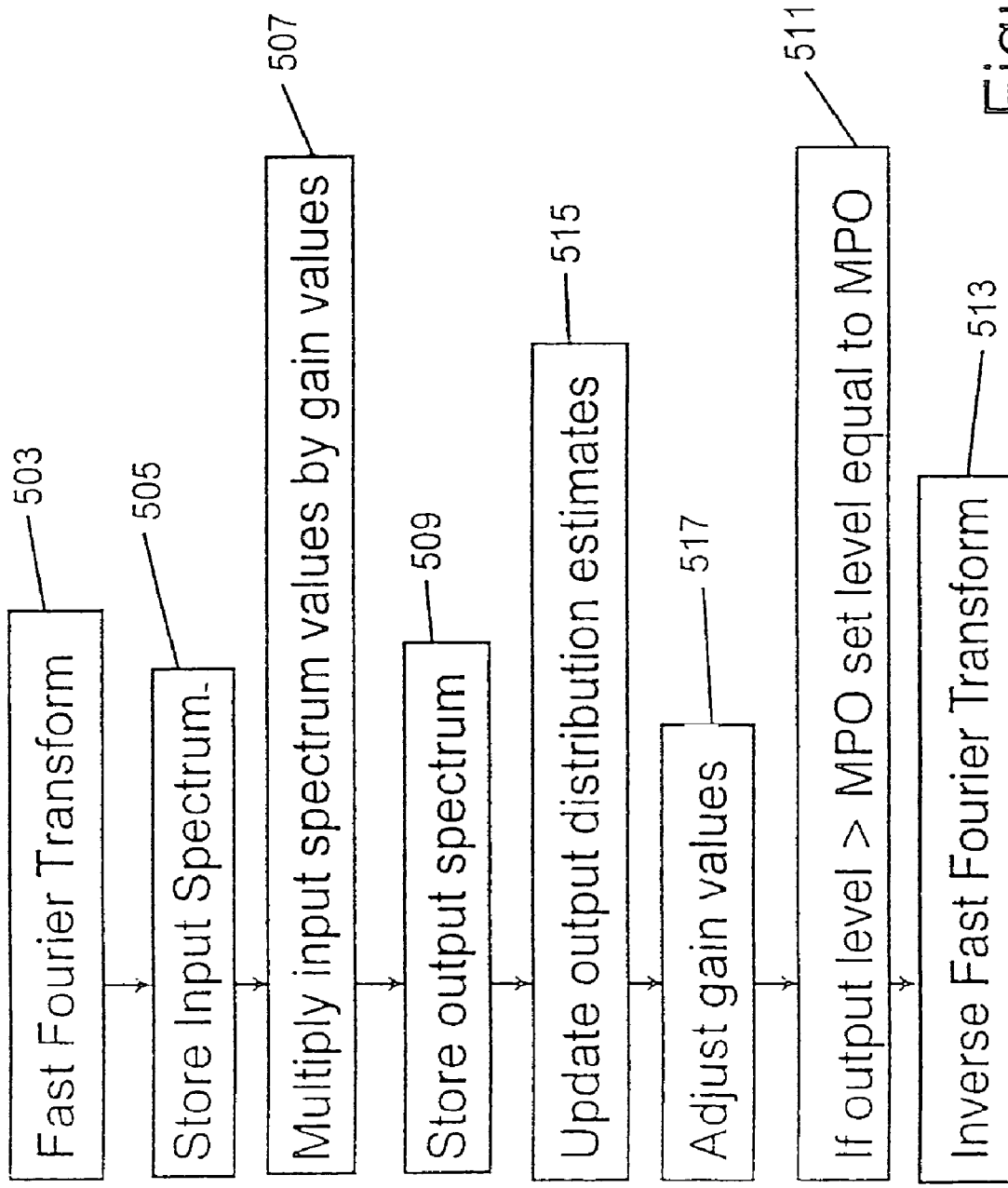
FIG. 5 is a block diagram of the method of operation of the hearing aid of FIG. 4.

Referring now to FIG. 5 a block diagram of the procedural steps followed by the program stored in EPROM 19 of FIG. 4 is presented.

At box 503 microprocessor 17 performs a fast Fourier transform upon the digital signal output of ADC 15. The fast Fourier transform produces an input spectrum consisting of N magnitude and N phase components which are stored in volatile memory, at box 505. Typically, N would take the value of 32, 64 or 128.

At box 507 each of the N magnitude components is multiplied by a corresponding one of N gain values. The results of the multiplications undertaken at box 507 are stored in volatile memory at box 509.

At box 515 each one of the N 30th, 70th and 98th percentiles of the distributions over time of the magnitudes of the frequency components is compared to the corresponding one of the N magnitude estimates of the output spectrum. The estimates are adjusted on the basis of the comparisons as will be explained with reference to FIG. 6.

At box 517 the percentile estimates are compared with values characteristic of a particular hearing response and on the basis of the comparisons the gain values at each frequency, are adjusted as will be later described in reference to FIG. 7.

At box 511 the magnitude of each of the N frequency components is compared to a predetermined maximum power output level (MPO) for that particular frequency component. If the magnitude of a frequency component is found to be greater than the MPO at the given frequency then it is set equal to the MPO level. This operation is designed to prevent fast transient signals of a certain frequency from rising above the LDL at that frequency without affecting signals at other frequencies. The MPO values are set during fitting of the ADRO hearing aid to suit the individual listener's hearing response. The MPO values used do not have to be the same as the LDL values, which are also predetermined during fitting, although they will usually be similar in value.

At box 513 an inverse fast Fourier transform is performed on the N magnitude and N phase components in order to reconstitute a digital time domain signal for subsequent processing by digital to analog converter 21.

Figure 6:
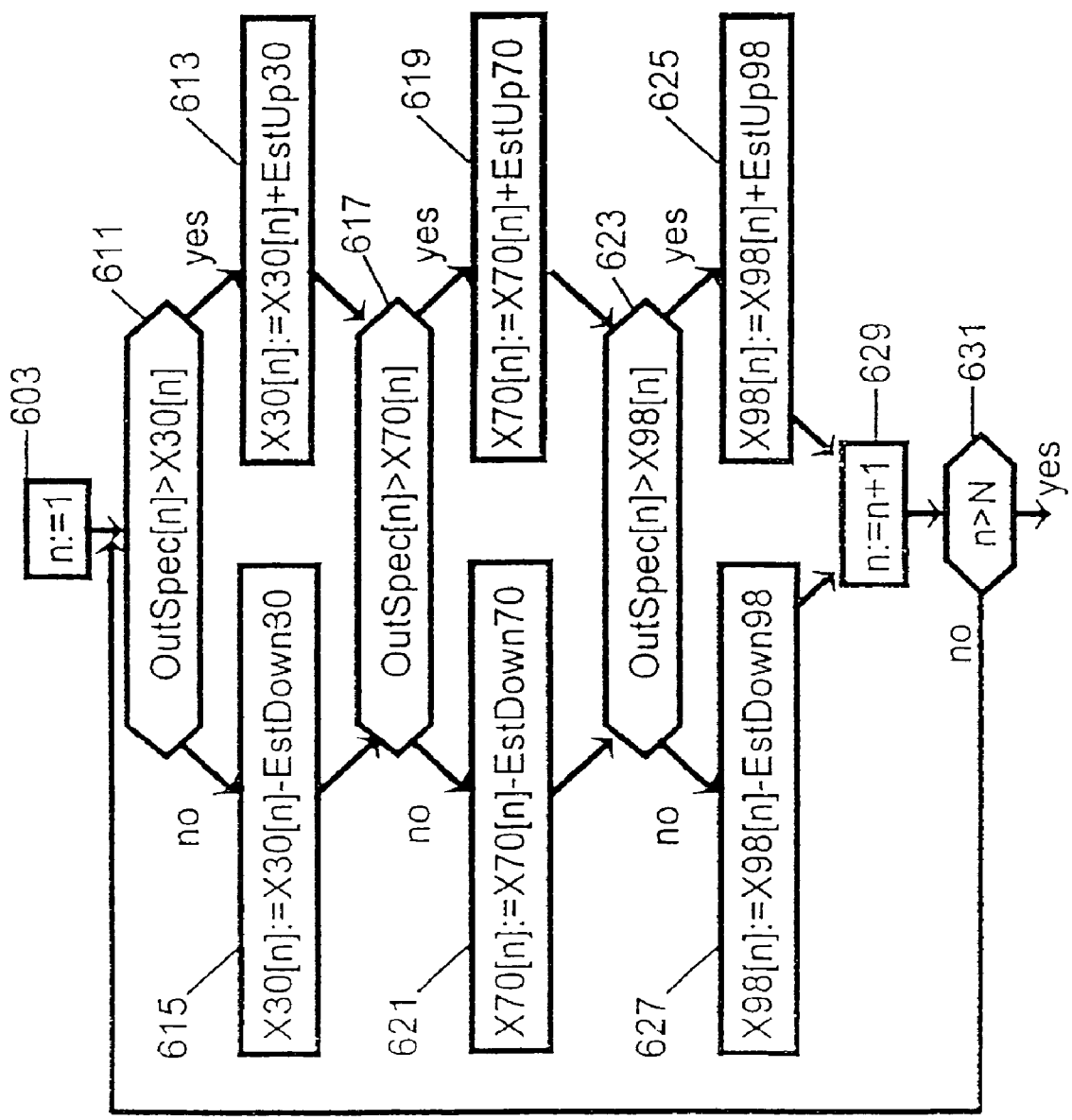
FIG. 6 is a detailed block diagram of the procedure followed at box 515 of FIG. 5.

Referring now to FIG. 6 there is depicted in detail a flowchart of the procedural steps required to implement box 515 of FIG. 5.

Figure 7:
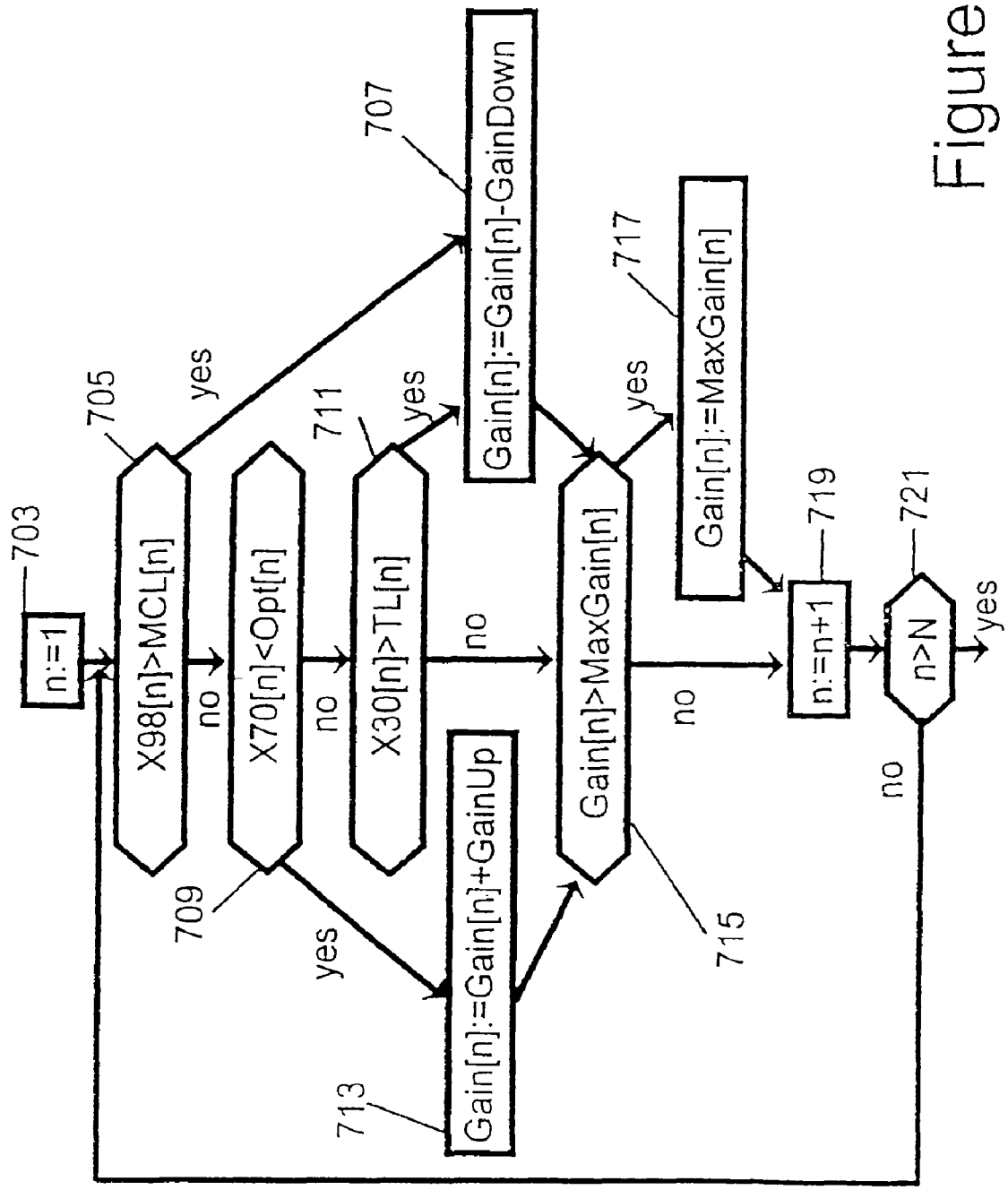
FIG. 7 is a detailed block diagram of the procedure followed at box 517 of FIG. 5.

Before explaining the procedural steps in the flowchart the following variables, which appear in FIG. 6 and FIG. 7 will be defined.

TL []: a one dimensional array for holding N threshold level values.

MCL []: a one dimensional array for holding N maximum comfortable levels. The MCL would usually be set just below the LDL at each frequency.

Opt []: a one dimensional array for holding N optimal audible levels. Opt [n] would typically be set halfway between TL [n] and MCL [n] at each frequency.

X30 []: a one dimensional array for representing the estimate of the 30th percentiles of the amplitude distributions of each of the N different frequency components.

X70 []: a one dimensional array for holding the estimates of the 70th percentiles of the amplitude distributions of each of the N frequency components.

98 []: a one dimensional array for holding the estimates of the 98th percentiles of the amplitude distributions of each of the N frequency components.

Gain []: a one dimensional array for holding the N gain values, one for each of the N frequency components.

GainUp: a variable for holding the magnitude of the step by which a value stored in Gain []is to be increased.

GainDown: a variable for holding the magnitude of the step by which a value stored in Gain []is to be decreased.

n: a counter variable for indexing a particular one of the N frequency components.

EstUp30: a variable for holding the magnitude of the step by which a X30 []value is to be increased.

EstDown30: a variable for holding the magnitude of the step by which a X30 []value is to be decreased.

EstUp70, EstDown70, EstUp98, EstDown98: corresponding variables for the 70th and 98th percentile estimates.

OutSpec []: a one dimensional array holding the magnitudes of the N frequency components of the output spectrum of box 509 of FIG. 5.

Returning now to FIG. 6 at box 603 counter n is set to 1. At box 611, the magnitude of the output spectrum at frequency n is compared with the estimate of the 30th percentile of the amplitude distribution at frequency n. If the magnitude is greater than or equal to the estimated 30th percentile, the estimate is increased by an amount EstUp30 at box 613, otherwise the estimate is decreased by an amount EstDown30 at box 615. The ratio of the step sizes EstUp to EstDown is equal to i/(100−i) where i is the required percentile. Thus for the 98th percentile (i.e. i=98), the EstUp step is 49 times the EstDown step.

For the 70th percentile (when i=70) the EstUp and EstDown steps in the ratio of 7:3. For the 30th percentile (when i=30) the EstUp and Est Down steps are in the ratio of 3:7. After repeated iterations through the process of FIG. 5, the estimates of the percentiles will stabilise at appropriate values.

For example, at the 98th percentile, large upward steps which occur 2% of the time will be balance by downward steps that are 49 times smaller but occur 49 times more frequently. By varying the TotalSstepSsize (which is equal to EstUp+EstDown) the maximum adaptation rate of the estimates can be controlled. Boxes 617 to 627 are used to estimate the 70th and 98th percentiles of the amplitude distribution in a manner analogous to the 30th percentile. The frequency counter is incremented at box 629. Box 631 transfers control back to the main process when the percentile estimates for each frequency have been updated.

Next referring to FIG. 7, the steps in adjusting the gain for each frequency are described. As in FIG. 6, variable n is used to step through the frequencies one at a time. If the 98th percentile estimate is greater than the maximum comfortable level at the given frequency, then the gain at the given frequency is reduced by one GainDown step at box 707. At box 709 the 70th percentile estimate of the current frequency components is compared with the optimum audibility level of the frequency components. If the 70th percentile is below the Opt value for the current frequency component, then the Gain at the given frequency is increased by one GainUp step at box 713. Alternatively if the tests at both box 705 and 709 are negative then control diverts to decision box 711. If the 30th percentile estimate exceeds the optimum audibility level value then control flows to box 707 where the gain at the frequency is reduced by one GainDown step. Box 715 tests the gain value for the current frequency component to see if it is so high that feedback is likely to occur. If the result of the test at box 715 is positive then the gain value for the current frequency is set to the highest value that does not cause feedback to occur at box 717. Control then flows to box 719 at which the frequency counter n is incremented and then to box 721 at which point the entire process is repeated with respect to the next frequency component.

It will be noted that the above procedure adjusts the gain values independently of the actual values of the input spectrum. As a result microphone 11 could be replaced with another microphone of arbitrary frequency response, an induction loop, an RF microphone or a direct connection to a telephone, or other electronic device, without requiring readjustment of the aid's operating parameters relating to the listener's hearing such as the LDL and threshold levels.

Furthermore, it will be understood that the invention acts to reduce the dynamic range of the components of the output spectrum relative to those of the input spectrum. For example, input acoustic signals may typically vary over a range of 100 dB in which case 19 bit arithmetic would be required to digitally implement percentile estimators responsive to the input spectrum. In contrast, the output signal for severely-hearing impaired users will only vary over about 50 dB so that advantageously only 10 bit arithmetic is required to implement percentile estimators in the arrangement of the present invention.

One parameter that must generally be adjusted in the event that the microphone is exchanged is the set of values stored in the MaxGain []array. The reason for this is that the gain depends on the difference between the input and output signals and not simply on the output signal. Feedback problems are unlikely to occur where the input microphone is acoustically well isolated from the output as is the case for an induction loop or telephone coil.

While the above system has been described with respect to a limited number of embodiments it will be realised that variations are possible. For example the output spectrum, digital output signal or corresponding analog output, generated during the various stages of processing could be passed directly to a cochlear implant processor, or digital sound processor, in which case the present invention would operate as the front-end of a further signal processor. An example of the general operation of a cochlear implant system is described in U.S. Pat. No. 4,532,930, the contents of which are incorporated herein by reference.

For hearing aids, headphones, and middle ear transducers, the signal from each of the FFT channels is processed by the ADRO Rules, including multiplication by the gain and maximum power output limiting. The processed channels are then recombined to produce a single signal channel using the inverse FFT.

In an alternative arrangement, a plurality of output signals can be applied to the electrodes of a cochlear implant.

In one arrangement, the FFT channels are combined to produce, for example, 22 channels before the ADRO processing is applied to each one of the combined channels. The ADRO processing refers to the gain multiplication and the maximum power output limiting.

Alternatively, the ADRO processing is applied to each one of the FFT channels, followed by a combination or selection of channels to produce the individual channels for the cochlear implant stimulation.

The final steps for the cochlear implant do not include the inverse FFT to produce a single output channel. Instead, the plurality of channel outputs are selectively coded as electrical signals to be applied to a plurality of electrodes, producing direct electrical excitation of auditory nerve fibres and the desired loudness perceptions in the defined output dynamic range at each stimulated electrode.

In the other cases (headphones, hearing aid, electro-mechanical transducer), the analog electrical output signal is applied directly to the input contacts of an electro-acoustic or electro-mechanical transducer which converts the electrical signal to an acoustic or mechanical vibration which is then transmitted to the inner ear by the usual means where it is processed by the usual hearing mechanisms.

The method according to this disclosure can be used to optimise combinations of acoustic and electric output signals either in a binaural bimodal device with acoustic signal in one ear and electric signal in the other or monaural hybrid device with electric and acoustic signals in the same ear at the same time.

An important feature inherent to the method according to this disclosure is that the phase of each of the FFT components is maintained during the limiting step. This minimises the distortion of the waveform after limiting of one or more components.

Both bimodal and hybrid stimulation perform better when the signals are presented with a common amplitude envelope (promoting fusion of the information from the two signals into a single perceptual stream), and at comparable loudness. Experimental and theoretical considerations of this point are covered by Blamey et al, Ear & Hearing 21, 6-17, 2000 "Monaural and binaural loudness measures in cochlear implant users with contralateral residual hearing." Subsequent clinical trials with this processing in cochlear implants (James et al, Ear & Hearing 23, 498-588, 2002) and hearing aids have shown improved speech perception, comfort and sound quality compared with alternative amplification schemes. The benefits come from individual optimization of output levels and information content in the plurality of frequency channels used in the processing. Provided that the matching and control of loudness is consistent across the output transducers, and across ears, as well as across frequency channels, these benefits will be maintained for combinations of electrical, mechanical, and acoustic output signals.

Some configurations of hearing loss make various combinations advantageous to individual listeners. For example, binaural fitting of headphones is most advantageous to a listener with normal hearing. For a person who has a severe hearing loss in both ears but does not want binaural surgery, or a person who has a moderate hearing loss in one ear and a total hearing loss in the other, a bimodal fitting of a hearing aid and a cochlear implant may be most advantageous. Hybrid fitting of a cochlear implant and hearing aid in one ear is appropriate for a person with good low frequency residual hearing and very poor high frequency hearing. Use of middle ear electro-mechanical transducers may be advantageous for some listeners with ossicular or tympanic membrane damage, or who are using a totally implanted hearing aid.

The invention might also be applied to ear muffs or hearing protectors in order to help people with normal hearing communicate in the presence of loud background noises such as hums, whistles and some types of static. Such noises are said to be stationary and have a narrow dynamic range so that their Low, Mid and High percentiles are close together. The Low percentile is constrained to lie below the threshold according to the above described embodiment of the invention.

Accordingly, the background noise is reduced to a low level. If the background noise is also characterised by having a narrow frequency range, such as a whistle, then a device according to the invention can be set to remove the noise from the output signal, while keeping most of the other (dynamic) spectral details unaffected.

Telephone and radio communication systems also have requirements for audibility and maximum power output levels that can be expressed similarly to the needs of hearing aid users. The present invention can be used to ensure that these requirements are met by an appropriate choice of the processing parameters. In these cases the threshold and LDL parameters would be determined for normal listeners and would not need to be adjusted on an individual basis. The invention can also be used to optimize signals prior to further analysis by, for example, an automatic speech recognition system.

Accordingly the following claims are to be constructed broadly and are not intended to be limited to the previously described preferred embodiment.

The invention claimed is:

1. A method of processing an ambient sound, comprising:
generating an input spectrum having discrete frequency components, each component including a coefficient defining the magnitude of said frequency component;
multiplying said magnitude coefficients by one or more gain values to generate adjusted frequency components;
comparing the magnitudes of said adjusted frequency components with one or more predetermined values;
attenuating the magnitudes of adjusted frequency components that are greater than said one or more predetermined values; and
providing an output spectrum signal including any of said attenuated adjusted frequency components and any of said adjusted frequency components having a magnitude that is less than said predetermined values.

2. The method of claim 1, further comprising:
performing an inverse Fourier transform on said output spectrum signal.

3. The method of claim 2, further comprising:
converting said output signal to an analog signal.

4. The method of claim 3, further comprising:
applying said analog signal to an electro-acoustical middle ear transducer.

5. The method of claim 3, further comprising:
applying said analog signal to an electromechanical middle ear transducer.

6. The method of claim 1, further comprising:
processing said output spectrum signal into an electrical signal for application to a cochlear implant electrode array.

7. The method of claim 1, wherein said one or more gain values are based upon one or more hearing response parameters.

8. The method of claim 7, wherein said one or more hearing response parameters are selected from the group comprising: loudness discomfort levels, maximum comfort levels, comfort levels, optimum audibility levels, and threshold levels.

9. The method of claim 1, further comprising:
determining one or more distribution values indicative of a distribution of the magnitude of at least one of said adjusted frequency components over a period of time.

10. The method of claim 9 wherein said one or more distribution values include values indicative of approximately the 30th, 70th, 90th and 98th percentiles of the magnitude of said at least one adjusted frequency component.

11. The method of claim 1, further comprising:
limiting the power of at least one of said frequency adjusted components.

12. A method for processing an ambient sound signal comprising:
generating a plurality of analysis signals each having a coefficient defining the magnitude of said signal;
multiplying said magnitude coefficients by one or more gain values to produce a plurality of magnitude adjusted analysis signals;
determining one or more distribution values characteristic of a magnitude distribution of at least one of said adjusted analysis signals over a period of time;
altering the magnitude of said at least one adjusted analysis signal on the basis of comparisons between said distribution values and one or more hearing response parameters; and
generating an output signal including said plurality of adjusted analysis signals and said adjusted analysis signal having an altered magnitude.

13. The method of claim 12, wherein said one or more hearing response parameters are selected from the group comprising: comfort target levels, maximum comfort levels, optimum audibility levels and threshold levels.

14. The method of claim 12, wherein said one or more distribution values comprise statistical values representing said distribution of the magnitude of said at least one adjusted analysis signal over a period of time.

15. The method of claim 12, wherein said one or more distribution values include percentile values of said distribution of the magnitude of said at least one adjusted analysis signal over a period of time.

16. The method of claim 15, wherein said distribution values include one or more of the approximately 10th, 30th, 70th, 90th, and 98th percentiles of the magnitude of said at least one adjusted analysis signal.

17. The method of claim 12, further comprising:
ensuring that the magnitude of said at least one adjusted analysis signal is less than a predetermined maximum power output level.

18. The method of claim 12, wherein generating said plurality of analysis signals includes:
applying a Fourier transform to the ambient sound signal.

19. The method of claim 12, further comprising:
performing an inverse fast Fourier transform on said output signal produce a digital time domain signal; and
converting said digital time domain signal to an analog signal.

20. The method of claim 12, further comprising:
feeding said output signal to an output system.

21. The method of claim 20, wherein said output system comprises an electro-acoustic output device.

22. The method of claim 20, wherein said output system comprises an electrode array of a cochlear implant.

23. The method of claim 22, wherein said output system comprises a binaural system.

24. The method of claim 23, wherein said binaural system comprises a bimodal device.

25. The method of claim 23, wherein said binaural system comprises headphones.

26. The method of claim 20, wherein said output system comprises an electro-acoustical middle ear transducer.

27. The method of claim 20, wherein said output system comprises an electromechanical middle ear transducer.

* * * * *